United States Patent
Gaide

(10) Patent No.: US 9,455,714 B1
(45) Date of Patent: Sep. 27, 2016

(54) CASCADED LUT CARRY LOGIC CIRCUIT

(71) Applicant: Xilinx, Inc., San Jose, CA (US)

(72) Inventor: Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 5 days.

(21) Appl. No.: 14/851,577

(22) Filed: Sep. 11, 2015

(51) Int. Cl.
*G06F 15/00* (2006.01)
*H03K 19/177* (2006.01)

(52) U.S. Cl.
CPC .... *H03K 19/17728* (2013.01); *H03K 19/1776* (2013.01); *H03K 19/17744* (2013.01)

(58) Field of Classification Search
None
See application file for complete search history.

(56) References Cited

U.S. PATENT DOCUMENTS

| | | | | |
|---|---|---|---|---|
| 6,118,300 A * | 9/2000 | Wittig | ............... | H03K 19/1737 326/41 |
| 2002/0186044 A1* | 12/2002 | Agrawal | ............ | H03K 19/1737 326/41 |
| 2005/0257024 A1* | 11/2005 | Ray | ....................... | G06F 9/3001 712/11 |

* cited by examiner

*Primary Examiner* — Crystal L Hammond
(74) *Attorney, Agent, or Firm* — Robert M. Brush

(57) ABSTRACT

In an example, a configurable logic element for a programmable integrated circuit (IC) includes a first lookup-table (LUT) including first inputs and first outputs, and first sum logic and first carry logic coupled between the first inputs and the first outputs; a second LUT including second inputs and second outputs, and second sum logic coupled between the second inputs and the second outputs; and first and second cascade multiplexers respectively coupled to the first and second LUTs, an input of the second cascade multiplexer coupled to an output of the first carry logic in the first LUT.

19 Claims, 6 Drawing Sheets

CASCADED LUT CARRY LOGIC CIRCUIT

TECHNICAL FIELD

Examples of the present disclosure generally relate to electronic circuits and, in particular, to a cascaded lookup-table (LUT) carry logic circuit.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

SUMMARY

A cascaded lookup-table (LUT) carry logic circuit is described. In an example, a configurable logic element for a programmable integrated circuit (IC) includes a first lookup-table (LUT) including first inputs and first outputs, and first sum logic and first carry logic coupled between the first inputs and the first outputs; a second LUT including second inputs and second outputs, and second sum logic coupled between the second inputs and the second outputs; and first and second cascade multiplexers respectively coupled to the first and second LUTs, an input of the second cascade multiplexer coupled to an output of the first carry logic in the first LUT.

In another example, a programmable integrated circuit (IC), includes a configuration memory; and a plurality of configurable logic elements coupled to the configuration memory. Each of the plurality of configurable logic elements includes a first lookup-table (LUT) including first inputs and first outputs, and first sum logic and first carry logic coupled between the first inputs and the first outputs; a second LUT including second inputs and second outputs, and second sum logic coupled between the second inputs and the second outputs; and first and second cascade multiplexers respectively coupled to the first and second LUTs, an input of the second cascade multiplexer coupled to an output of the first carry logic in the first LUT.

In another example, a method of configuring a programmable integrated circuit (IC) includes configuring a first lookup-table (LUT) in a configurable logic element to compute a first sum, the first LUT including first inputs and first outputs, and first sum logic and first carry logic coupled between the first inputs and the first outputs; configuring a second LUT in the configurable logic element to compute a second sum, the second LUT including second inputs and second outputs, and second sum logic coupled between the second inputs and the second outputs; and configuring a cascade multiplexer to couple an output of the first carry logic in the first LUT to an input of the second sum logic in the second LUT.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
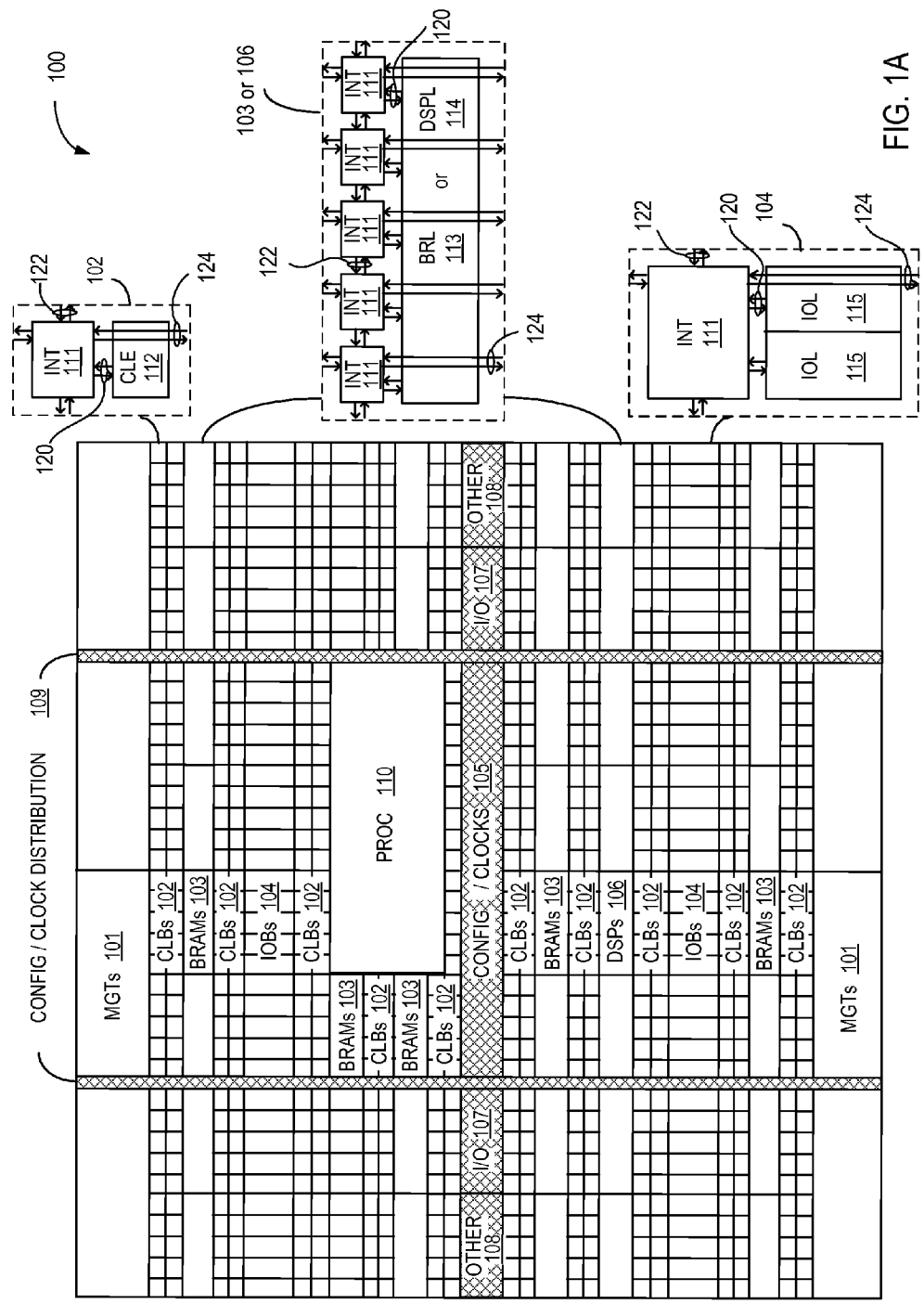
FIG. 1A illustrates an example architecture of an FPGA.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

A cascaded lookup-table (LUT) carry logic circuit is described. In an example, a configurable logic element (CLE) for a programmable integrated circuit (IC), such as an FPGA, includes a pair of lookup tables (LUTs). A first lookup-table (LUT) includes first inputs and first outputs, and first sum logic and first carry logic coupled between the first inputs and the first outputs. A second LUT includes second inputs and second outputs, and second sum logic coupled between the second inputs and the second outputs. The CLE includes first and second cascade multiplexers respectively coupled to the first and second LUTs. An input of the second cascade multiplexer is coupled to an output of the first carry logic in the first LUT. In another example, carry logic can also be incorporated into the second LUT in the LUT pair.

In the example CLE described herein, the sum and carry logic is incorporated into one or more LUTs of the CLE. Carry initialization can be performed by the cascade multiplexers. The cascade multiplexers speed up generic LUT-to-LUT direct connections. Both sum and carry out outputs are directly provided by the LUTs. This allows output multiplexers driven by these signals to be reduced in size, since such output multiplexers would otherwise require separate outputs for sum, carry, and outputs of the LUTs. Since each of the LUTs includes a cascade multiplexer coupled thereto, it is possible to start/initialize a carry chain at every LUT, which enables more efficient multiple carry chain packing. These and further aspects are described below with respect to the following figures.

FIG. 1A illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
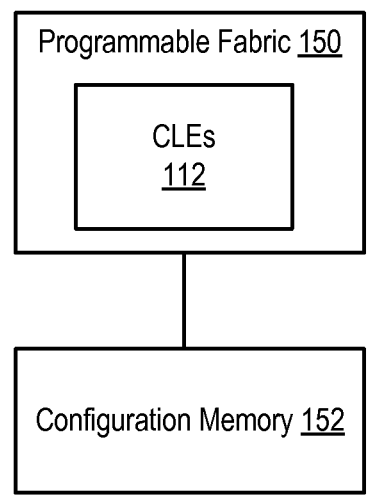
FIG. 1B is a block diagram depicting a higher-level view of the FPGA of FIG. 1 according to an example.

FIG. 1B is a block diagram depicting a higher-level view of the FPGA 100 according to an example. The FPGA 100 includes a programmable fabric 150, which can include the various programmable tiles described above. The programmable fabric 150 is coupled to a configuration memory 152. The configuration memory 152 comprises a random access memory (RAM), such as a static RAM (SRAM) or the like. The programmable fabric 150 can also include CLEs 112 having cascaded LUT carry logic as described herein. The configuration memory 152 can be loaded with a configuration bitstream for programming ("configuring") the programmable fabric 150. For example, a configuration bitstream can be loaded into the configuration memory 152 to configure the CLEs 112 of the programmable fabric 150, as described herein.

Figure 2:
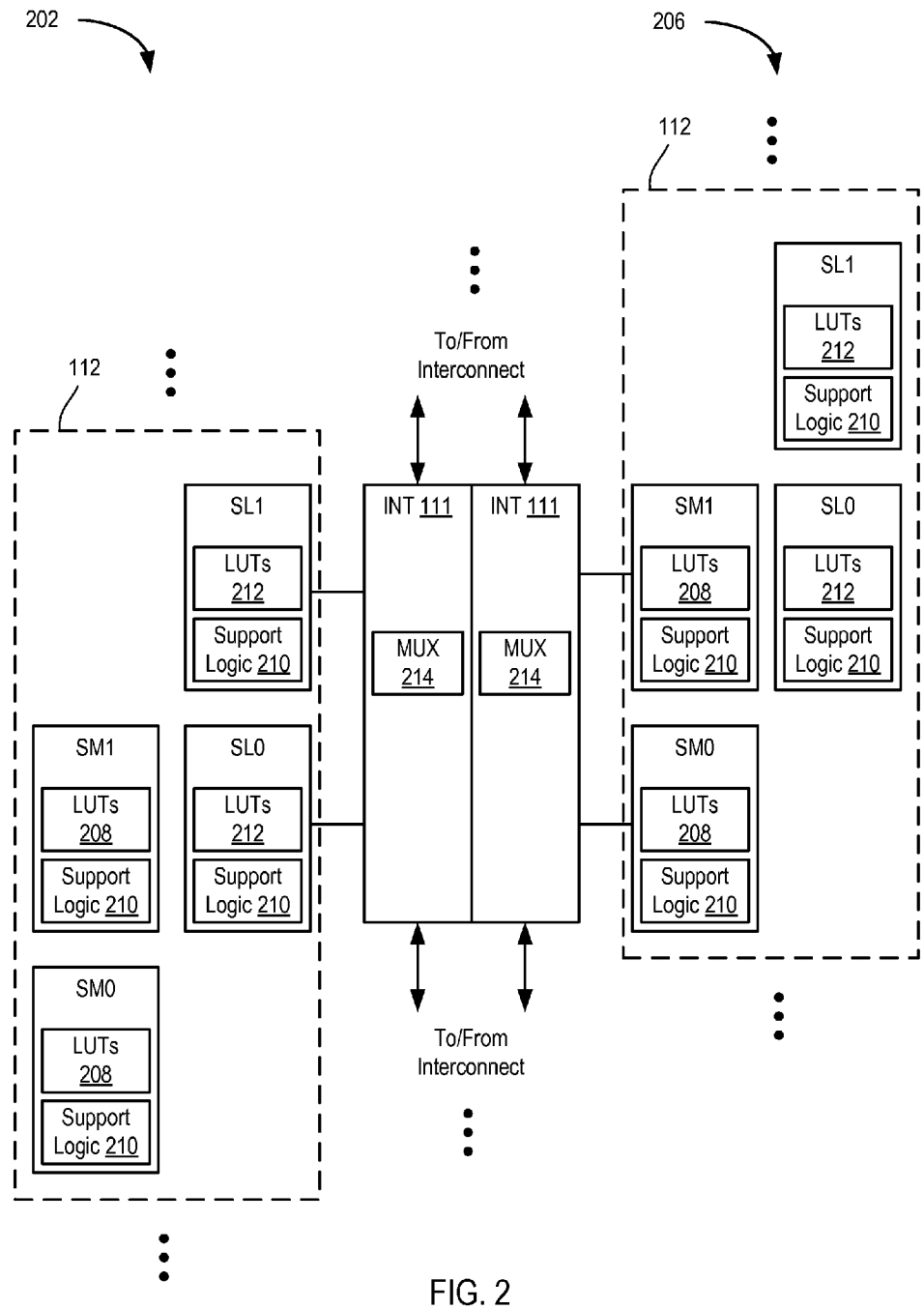
FIG. 2 is a block diagram depicting a floorplan of the programmable fabric of the FPGA of FIG. 1.

FIG. 2 is a block diagram depicting a floorplan of the programmable fabric 150 of the FPGA 100. FIG. 2 shows two columns 202 and 206 of programmable tiles in the programmable fabric 150. The programmable tiles in the columns 202 and 206 comprise CLEs 112. In each of the columns 202 and 206, only one CLE 112 is shown, but the columns 202 and 206 generally include a plurality of CLEs. Each of the CLEs 112 is coupled to an interconnect element 111.

Each of the CLEs 112 comprises four slices SM1-SM0 and SL0-SL1. The slices SM0-SL1 are of one type (type "M"), the slices SL0-SL1 are of another type (type "L"). The type "M" slices SM0 and SM1 include lookup tables (LUTs) 208 and support logic 210. The LUTs 208 can be configured as function generators to perform any combinatorial function having a plurality of inputs and a plurality of outputs. The LUTs 208 can also be configured as a LUT-RAM configured to store a plurality of bits. The support logic 210 can include flip-flops, multiplexers, carry-chain logic, and the like that support the LUTs 208. The type "L" slices SL0 and SL1 include LUTs 212 and support logic 210. The LUTs 212 can be configured as function generators, but not as LUT-RAM. The architecture shown in FIG. 2 is just one example. In other examples, all LUTs in a CLE 112 can comprise LUT-RAMs (every slice is of type "M"), or all LUTs in a CLE 112 can comprise LUTs that cannot be configured as a RAM (every slice is of type "L").

In the example, the type "L" slices SL0 and SL1 in the column 202 are adjacent the type "M" slices SM0 and SM1 in the column 206 having two interconnect elements 111 therebetween. The slices SL0-SL1 in the column 202 are coupled to one of the interconnect elements 111, and the slices SM0-SM1 in the column 206 are coupled to another of the interconnect elements 111. The interconnect elements 111 can be coupled to each other. Each of the interconnect elements 111 includes multiplexers 214. Different ones of the multiplexers 214 can have different inputs, such as inputs from the CLE 112 in the column 202, inputs from the CLE 112 in the column 206, inputs from multiplexers 214 in another interconnect element 111, or inputs from the interconnect. Likewise, different ones of the multiplexers 214 can have different outputs, such as outputs to the CLE 112 in the column 202, outputs to the CLE 112 in the column 206, outputs to another interconnect element 111, or outputs to the interconnect.

As described herein, the LUTs 208 and/or the LUTs 212 can include internal sum and carry logic, removing the need for such sum and carry logic to be included in the support logic 210. This reduces output multiplexer costs for the CLE 112. This also results in fewer possible critical paths, which optimizes performance of the CLE 112. Further, carry chains can be initialized at any LUT in the CLE 112, which enables packing of multiple carry chains in finer granularities.

Figure 3:
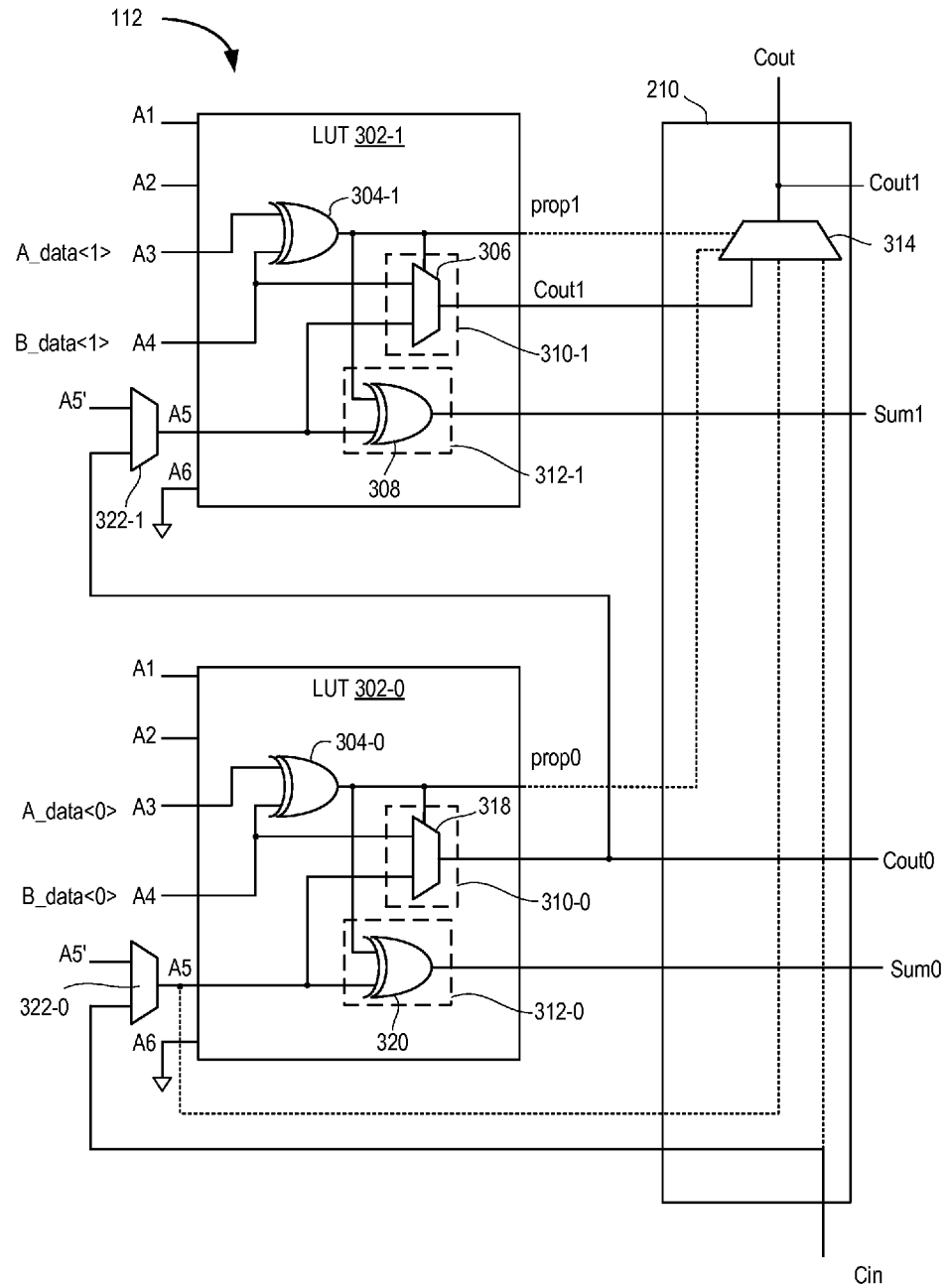
FIG. 3 is a block diagram depicting a configurable logic element according to an example.

FIG. 3 is a block diagram depicting a configurable logic element 112 according to an example. In the present example, the configurable logic element 112 includes a pair of LUTs 302-0 and 302-1 (collectively LUTs 302). While only two LUTs are shown in the example, as described above, a CLE 112 can have one or more slices, each having one or more LUTs.

Each of the LUTs 302 includes sum logic 312 and carry logic 310 therein. In the example, the LUT 302-0 includes sum logic 312-0 and carry logic 310-0, and the LUT 302-1 includes sum logic 312-1 and carry logic 310-1. In the example, the sum logic 312 comprises an exclusive OR (XOR) gate, and the carry logic 310 comprises a multiplexer. Thus, the sum logic 312-0 comprises a logic gate 320, and the sum logic 312-1 comprises a logic gate 308. In the example, each of the logic gates 308 and 320 comprises an XOR gate. Likewise, the carry logic 310-0 comprises a multiplexer 318, and the carry logic 310-1 comprises a multiplexer 306. The LUT 302-0 further includes a logic gate 304-0, and the LUT 302-1 further includes a logic gate 304-1. In the example, each of the logic gates 304-0 and 304-1 comprises an XOR gate.

Each of the LUTs 302 includes six inputs designated A1 through A6. In the LUT 302-0, the inputs A3 and A4 are coupled to inputs of the logic gate 304-0. The input A5 is coupled to an output of a cascade multiplexer 322-0. The input A6 is shown as being connected to a reference voltage (e.g., electrical ground). In the present example, the inputs A1 and A2 are unconnected. An output of the logic gate 304-0 is designated prop0. A control input of the multiplexer 318 is coupled to receive prop0. Inputs of the multiplexer 318 are coupled to inputs A4 and A5. Inputs of the logic gate 320 are coupled to the input A5 and the output of the logic gate 304-0 (prop0). An output of the multiplexer 318 is designated Cout0, and the output of the logic gate 320 is designated Sum0.

In the LUT 302-1, the inputs A3 and A4 are coupled to inputs of the logic gate 304-1. The input A5 is coupled to an output of a cascade multiplexer 322-1. The input A6 is shown as being connected to a reference voltage (e.g., electrical ground). In the present example, the inputs A1 and A2 are unconnected. An output of the logic gate 304-1 is designated prop1. A control input of the multiplexer 306 is coupled to receive prop1. Inputs of the multiplexer 306 are coupled to inputs A4 and A5. Inputs of the logic gate 308 are coupled to the input A5 and the output of the logic gate 304-1 (prop1). An output of the multiplexer 306 is designated Cout1', and the output of the logic gate 308 is designated Sum1.

One input of the cascade multiplexer 322-0 is designated A5', and another input of the cascade multiplexer 322-0 is coupled to a node Cin. One input of the cascade multiplexer 322-1 is designated A5', and another input of the cascade multiplexer 322-1 is coupled to the output of the multiplexer 318 (Cout0).

In the example, the support logic 210 for the CLE 112 includes a carry chain multiplexer 314. An output of the carry chain multiplexer 314 is designated by Cout. A control interface of the carry chain multiplexer 314 can be coupled to receive prop0, prop1, or both. An input of the carry chain multiplexer 314 is coupled to receive Cout1'. Other input(s) of the carry chain multiplexer 314 can be coupled to receive the output of the cascade multiplexer 322-0, Cin, or both.

In operation, the LUTs 302-0 and 302-1 compute the sum of data words A_data and B_data. In the present example, data words A_data and B_data each have two bits designated <0> and <1>. Inputs A3 and A4 of the LUT 302-0 receive A_data<0> and B_data<0>, respectively. Inputs A3 and A4 of the LUT 302-1 receive A_data<1> and B_data<1>, respectively.

The logic gate 304-0 computes the sum of A_data<0> and B_data<0> (i.e., prop0=A_data<0>+B_data<0>). The logic gate 320 adds a carry bit to the sum of A_data<0> and B_data<0> (i.e., sum0=A_data<0>+B_data<0>+carry). The carry bit is output by the cascade multiplexer 322-0, which can be input through A5' or through Cin (the carry input to the CLE 112). The multiplexer 318 outputs a carry bit for the sum operation performed by LUT 302-0 (designated Cout0).

The logic gate 304-1 computes the sum of A_data<1> and B_data<1> (i.e., prop1=A_data<1>+B_data<1>). The logic gate 308 adds a carry bit to the sum of A_data<1> and B_data<1> (i.e., sum1=A_data<1>+B_data<1>+carry). The carry bit is output by the cascade multiplexer 322-1, which can be input through A5' or through the output of the multiplexer 318 (e.g., Cout0). For determining A_data+B_data, the multiplexer 322-1 selects Cout0 as the carry bit. The multiplexer 306 outputs a carry bit for the sum operation performed by LUT 302-1 (designated Cout1').

The carry chain multiplexer 314 outputs a carry bit for the CLE 112. The carry bit for the CLE 112 can be Cout1 (for the operation A_data+B_data). For other operations, it is also possible for the Gout to be Cin (carry pass through) or the output of the cascade multiplexer 322-0. The CLE 112 shown in FIG. 3 can be replicated and chained together to compute the sum or A_data and B_data having an arbitrary number of bits.

In the example of FIG. 3, the sum and carry logic is incorporated into the LUTs 302 of the CLE 112. Carry initialization can be performed by the cascade multiplexers 322. The cascade multiplexers 322 speed up generic LUT-to-LUT direct connections. Both sum and carry out outputs are directly provided by the LUTs 302. This allows output multiplexers driven by these signals (e.g., within interconnect 111) to be reduced in size, since such output multiplexers would otherwise require separate outputs for sum, carry, and outputs of the LUTs 302. Since each of the LUTs 302 includes a cascade multiplexer 322 coupled thereto, it is possible to start/initialize a carry chain at every LUT, which enables more efficient multiple carry chain packing. Further, the sum output is not dedicated and the logic gate 304 that computes the sum can be some other function other than XOR.

Figure 4:
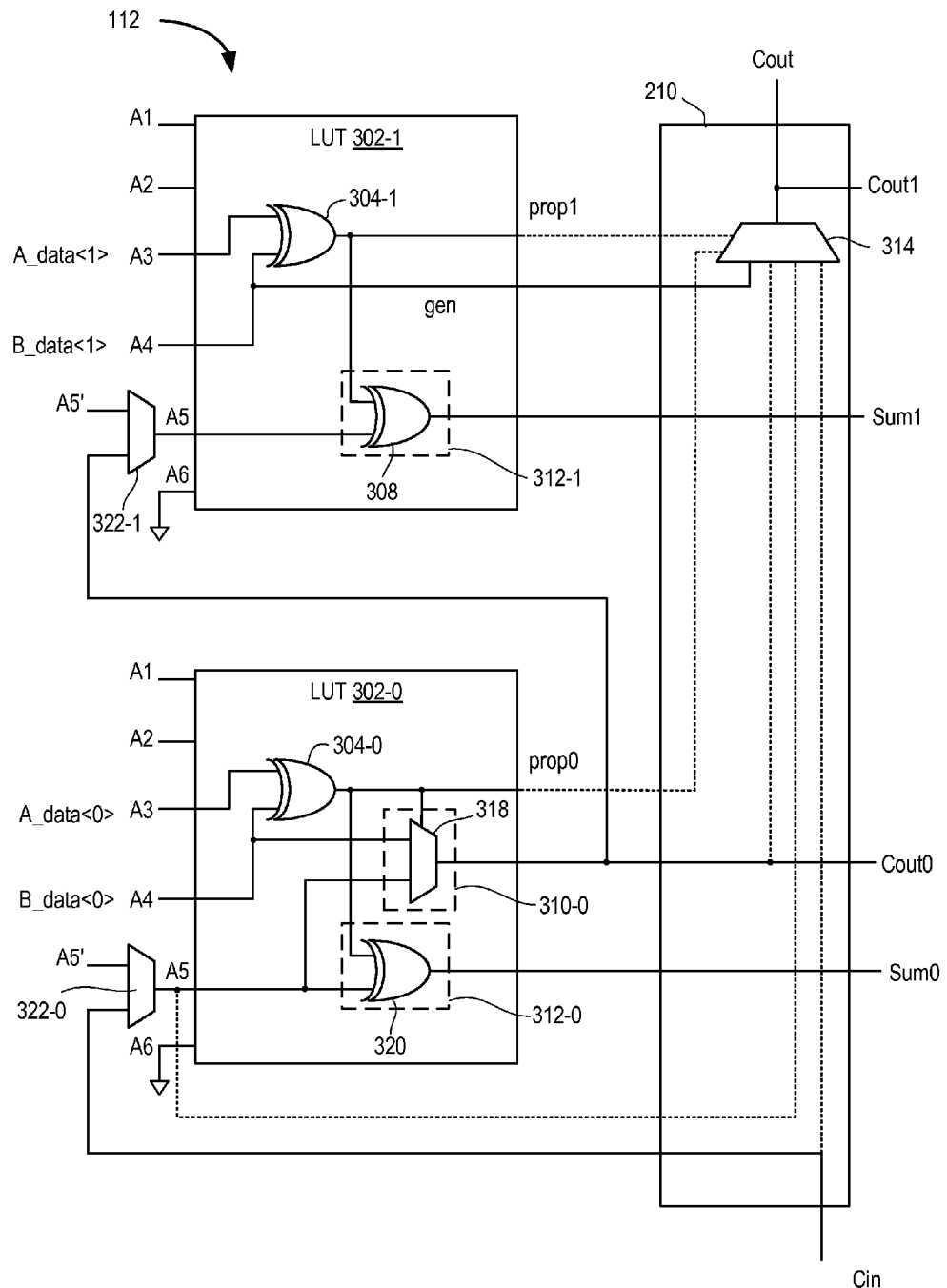
FIG. 4 is a block diagram depicting a configurable logic element according to another example.

FIG. 4 is a block diagram depicting a configurable logic element 112 according to another example. Elements that are the same or similar to those described above are designated with identical reference numerals. In the present example, the output of the multiplexer 318 in the carry logic 310-0 (Cout0) is coupled to an input of the carry chain multiplexer 314. Further, the carry logic 310-1 is omitted from the LUT 302-1. Rather, the input A4 of the LUT 302-1 is coupled to an input of the carry chain multiplexer 314. The remainder of the configurable logic element 112 is implemented as described above with respect to FIG. 3.

In configurable logic element 112 as shown in FIG. 4, the input of the carry chain multiplexer 314 expands to receive the carry out (Cout0) from the LUT 302-0 directly. In this manner, the carry out (Cout0) from the LUT 302-0 does not have to propagate through to the LUT 302-1 in order to get to the carry chain multiplexer 314. Further, since the carry out (Cout0) of the LUT 302-0 is connected directly to the multiplexer 314, the carry logic 310-1 can be removed.

In the examples of FIGS. 3 and 4, two bits of carry (Cout0 and Cout1) are shown. In general, the circuits in FIGS. 3 and 4 can be expanded to generate N bits of carry, where N is positive integer. In such examples, the carry chain multiplexer 314 can include increased width to accommodate the additional bits of carry generated by other LUTs. Further, in the examples discussed above, the carry logic structure is described with respect to addition operations. In general, the carry logic structure described herein can be used to perform all or a portion of other types of arithmetic operations.

Figure 5:
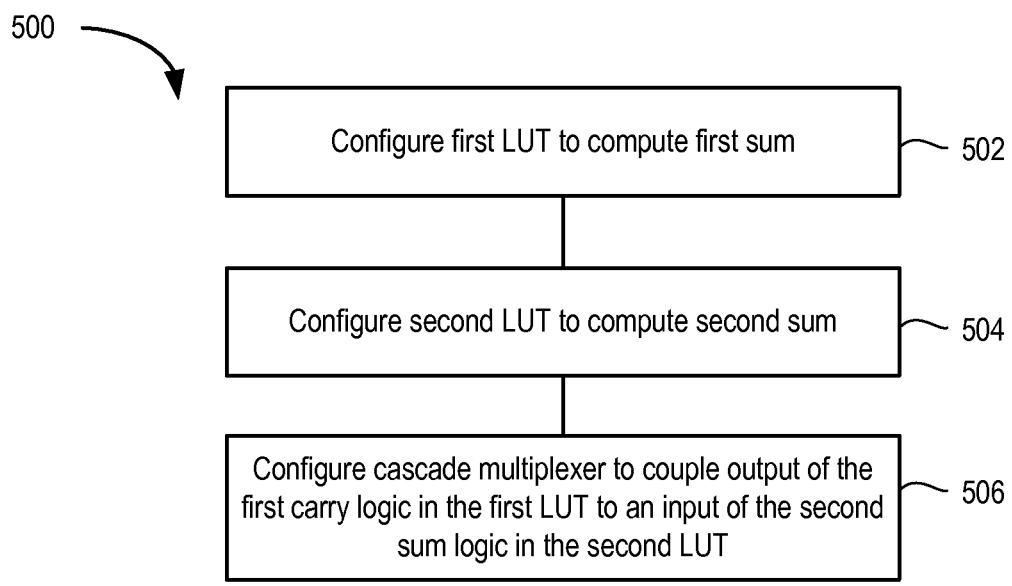
FIG. 5 is a flow diagram depicting a method of configuring a programmable integrated circuit (IC) according to an example.

FIG. 5 is a flow diagram depicting a method 500 of configuring a programmable integrated circuit (IC) according to an example. The method 500 begins at block 502, where a first LUT in a CLE is configured to compute a first sum, the first LUT including first inputs and first outputs, and first sum logic and first carry logic coupled between the first inputs and outputs. At block 504, a second LUT in the CLE is configured to compute a second sum, the second LUT including second inputs and second outputs, and second sum logic and second carry logic coupled between the second inputs and outputs. At block 506, a cascade multiplexer is configured to couple an output of the first carry logic in the first LUT to an input of the second sum logic in the second LUT. The method 500 can be repeated for one or more additional LUTs to compute the sum of data words having an arbitrary number of bits.

While the foregoing is directed to specific examples, other and further examples may be devised without departing from the basic scope thereof, and the scope thereof is determined by the claims that follow.

What is claimed is:

1. A configurable logic element for a programmable integrated circuit (IC), comprising:
a first lookup-table (LUT) including a first logic gate, first sum logic, and first carry logic, where first, second, and third inputs of the first carry logic are respectively coupled to a first input of the first logic gate, a first input of the first sum logic, and an output of the first logic gate, and where a second input of the first sum logic coupled to the output of the first logic gate;
a first cascade multiplexer having an output coupled to the first input of the sum logic;
a second cascade multiplexer having an input coupled to an output of the first carry logic; and
a second LUT including a second logic gate and second sum logic, where first and second inputs of the second sum logic are respectively coupled to an output of the second logic gate and an output of the second cascade multiplexer.

2. The configurable logic element of claim 1, further comprising:
a carry chain multiplexer coupled to at least one of the first LUT or the second LUT.

3. The configurable logic element of claim 2, wherein the second LUT includes second carry logic, and wherein an input of the carry chain multiplexer is coupled to an output of the second carry logic in the second LUT.

4. The configurable logic element of claim 2, further comprising:
a carry input coupled to an input of the first cascade multiplexer.

5. The configurable logic element of claim 4, wherein the carry input is further coupled to an input of the carry chain multiplexer.

6. The configurable logic element of claim 2, wherein an input of the carry chain multiplexer is coupled to the output of the first cascade multiplexer.

7. The configurable logic element of claim 1, wherein each of the first and second sum logic comprises an exclusive OR gate, and wherein the first carry logic comprises a multiplexer.

8. The configurable logic element of claim 7, wherein a control terminal of the multiplexer of the first carry logic is coupled to the output of the first logic gate in the first LUT.

9. The configurable logic element of claim 8, further comprising:
a carry chain multiplexer coupled to at least one of the first LUT or the second LUT, a control interface of the carry chain multiplexer coupled to the output of at least one of the first logic gate or the second logic gate.

10. The configurable logic element of claim 1, wherein control terminals of the first and second cascade multiplexers are coupled to configurable memory cells in the programmable IC.

11. A programmable integrated circuit (IC), comprising:
a configuration memory; and
a plurality of configurable logic elements coupled to the configuration memory, each of the plurality of configurable logic elements comprising:
a first lookup-table (LUT) including a first logic gate, first sum logic, and first carry logic, where first, second, and third inputs of the first carry logic are respectively coupled to a first input of the first logic gate, a first input of the first sum logic, and an output of the first logic gate, and where a second input of the first sum logic coupled to the output of the first logic gate;

a first cascade multiplexer having an output coupled to the first input of the sum logic;

a second cascade multiplexer having an input coupled to an output of the first carry logic; and a second LUT including a second logic gate and second sum logic, where first and second inputs of the second sum logic are respectively coupled to an output of the second logic gate and an output of the second cascade multiplexer.

12. The programmable IC of claim 11, further comprising: a carry chain multiplexer coupled to at least one of the first LUT or the second LUT.

13. The programmable IC of claim 12, wherein the second LUT includes second carry chain logic, and wherein an input of the carry chain multiplexer is coupled to an output of the second carry logic in the second LUT.

14. The programmable IC of claim 12, further comprising:

a carry input coupled to an input of the first cascade multiplexer.

15. The programmable IC of claim 14, wherein the carry input is further coupled to an input of the carry chain multiplexer.

16. The programmable IC of claim 12, wherein an input of the carry chain multiplexer is coupled to the output of the first cascade multiplexer.

17. The programmable IC of claim 11, wherein each of the first and second sum logic comprises an exclusive OR gate, and wherein the first carry logic comprises a multiplexer.

18. The programmable IC of claim 17, wherein a control terminal of the multiplexer of the first carry logic is coupled to the output of the first logic gate in the first LUT.

19. The programmable IC of claim 11, wherein control terminals of the first and second cascade multiplexers are coupled to configurable memory cells in the programmable IC.

* * * * *